US012640723B2

(12) United States Patent
Liu et al.

(10) Patent No.: US 12,640,723 B2
(45) Date of Patent: May 26, 2026

(54) DYNAMIC PROTECTION CIRCUIT, POWER SUPPLY CIRCUIT AND CONTROL METHOD THEREOF

(71) Applicant: Nuvoton Technology Corporation, Hsinchu Science Park (TW)

(72) Inventors: Jen-Chih Liu, Kaohsiung City (TW); Chieh-Sheng Tu, Hsinchu City (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 203 days.

(21) Appl. No.: 18/660,906

(22) Filed: May 10, 2024

(65) Prior Publication Data

US 2024/0421812 A1     Dec. 19, 2024

(30) Foreign Application Priority Data

Jun. 13, 2023    (TW) ................................. 112121923

(51) Int. Cl.
*H03K 17/0814* (2006.01)
*H03K 21/02* (2006.01)
*H03K 21/38* (2006.01)

(52) U.S. Cl.
CPC ....... *H03K 17/0814* (2013.01); *H03K 21/026* (2013.01); *H03K 21/38* (2013.01)

(58) Field of Classification Search
CPC ............ H02H 3/20; H02H 3/24; H02H 7/125; H03K 17/0814; H03K 21/026; H03K 21/38
USPC ......................................................... 361/56
See application file for complete search history.

(56) References Cited

U.S. PATENT DOCUMENTS

| | | | |
|---|---|---|---|
| 9,705,394 B2 | 7/2017 | Ohshima | |
| 9,960,705 B1 | 5/2018 | Pidutti et al. | |
| 10,180,670 B2 | 1/2019 | Sugeno et al. | |
| 2015/0280578 A1* | 10/2015 | Huang | H02M 1/32 |
| | | | 363/21.12 |
| 2017/0023905 A1* | 1/2017 | Tsuchiya | H02M 1/32 |

(Continued)

FOREIGN PATENT DOCUMENTS

TW        M284035 U    12/2005

OTHER PUBLICATIONS

Taiwan Office Action dated May 23, 2024 in Application No. 112121923 is attached, 9 pages.

*Primary Examiner* — Kevin J Comber
(74) *Attorney, Agent, or Firm* — MUNCY, GEISSLER, OLDS & LOWE, P.C.

(57)         ABSTRACT

A dynamic protection circuit including an adjustment circuit, a detection circuit, a control circuit, and a counter circuit is provided. The adjustment circuit adjusts an output voltage based on a predetermined value. The detection circuit detects whether the output voltage is higher than an upper-limit value or lower than a lower-limit value. The control circuit changes the predetermined value and disables the detection circuit while the predetermined value is being changed. The counter circuit starts to adjust a count value in response to the detection circuit being disabled. In response to the counter circuit adjusting the count value, the control circuit adjusts the upper-limit value and the lower-limit value to be proportional to the output voltage. In response to the count value being equal to a target value, the counter circuit enables the detection circuit.

20 Claims, 4 Drawing Sheets

(56)            References Cited

U.S. PATENT DOCUMENTS

2018/0123339  A1 *    5/2018   Lin   ..................   H02M 3/33523
2020/0195150  A1 *    6/2020   Yang   ................   H02M 3/33592

* cited by examiner

DYNAMIC PROTECTION CIRCUIT, POWER SUPPLY CIRCUIT AND CONTROL METHOD THEREOF

CROSS REFERENCE TO RELATED APPLICATIONS

This application claims priority of Taiwan Patent Application No. 112121923, filed on Jun. 13, 2023, the entirety of which is incorporated by reference herein.

BACKGROUND OF THE INVENTION

Field of the Invention

The present invention relates to a power supply circuit, and, in particular, to a power supply circuit that proportionally adjusts a voltage upper-limit value and a voltage lower-limit value when the power supply circuit adjusts the output voltage.

Description of the Related Art

Generally, a power supply circuit provides an appropriate power to an external device based on the request from the external device. The power supply circuit has an overvoltage protection function and an undervoltage protection function. When the power provided by the power supply circuit is higher than an overvoltage protection value or lower than an undervoltage protection value, this indicates that the power is abnormal. Therefore, the power supply circuit may stop providing the power. However, when the power supply circuit adjusts the power, the power supply circuit cannot immediately adjust the overvoltage protection value and the undervoltage protection value due to insufficient bus. The operation of the power supply circuit may be abnormal to mistakenly determine that an overvoltage event or an undervoltage event occurs.

BRIEF SUMMARY OF THE INVENTION

In accordance with an embodiment of the disclosure, a dynamic protection circuit comprises an adjustment circuit, a detection circuit, a control circuit, and a counter circuit. The adjustment circuit adjusts an output voltage based on a predetermined value. The detection circuit detects whether the output voltage is higher than an upper-limit value or lower than a lower-limit value. The control circuit changes the predetermined value and disables the detection circuit while the predetermined value is being changed. The counter circuit starts to adjust a count value in response to the detection circuit being disabled. In response to the counter circuit adjusting the count value, the control circuit adjusts the upper-limit value and the lower-limit value to be proportional to the output voltage. In response to the count value being equal to a target value, the counter circuit enables the detection circuit.

In accordance with another embodiment of the disclosure, a power supply circuit comprises a conversion circuit, a processing circuit, a switch, and a dynamic protection circuit. The conversion circuit converts an external power into a direct current (DC) power. The processing circuit processes the DC power to generate an output voltage. The switch is configured to transmit the output voltage. The dynamic protection circuit comprises an adjustment circuit, a detection circuit, a control circuit, and a counter circuit. The adjustment circuit adjusts an output voltage based on a predetermined value. The detection circuit detects whether the output voltage is higher than an upper-limit value or lower than a lower-limit value. The control circuit changes the predetermined value and disables the detection circuit while the predetermined value is being changed. The counter circuit starts to adjust a count value in response to the detection circuit being disabled. In response to the counter circuit adjusting the count value, the control circuit adjusts the upper-limit value and the lower-limit value to be proportional to the output voltage. In response to the count value being equal to a target value, the counter circuit enables the detection circuit.

An exemplary embodiment of a control method is described in the following paragraph. An output voltage is generated based on a predetermined value. The predetermined value is changed. An overvoltage protection circuit and an undervoltage protection circuit are disabled. The overvoltage protection circuit determines whether the output voltage is higher than an upper-limit value. The undervoltage protection circuit determines whether the output voltage is lower than a lower-limit value. A timing operation is performed. The upper-limit value and the lower-limit value are adjusted. In response to the duration of the timing operation reaching a target value, the step of adjusting the upper-limit value and the lower-limit value is stopped and the step of disabling the overvoltage protection circuit and the undervoltage protection circuit is stopped.

Control methods may be practiced by the systems which have hardware or firmware capable of performing particular functions and may take the form of program code embodied in a tangible media. When the program code is loaded into and executed by an electronic device, a processor, a computer or a machine, the electronic device, the processor, the computer or the machine becomes a dynamic protection circuit and a power supply circuit for practicing the disclosed method.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
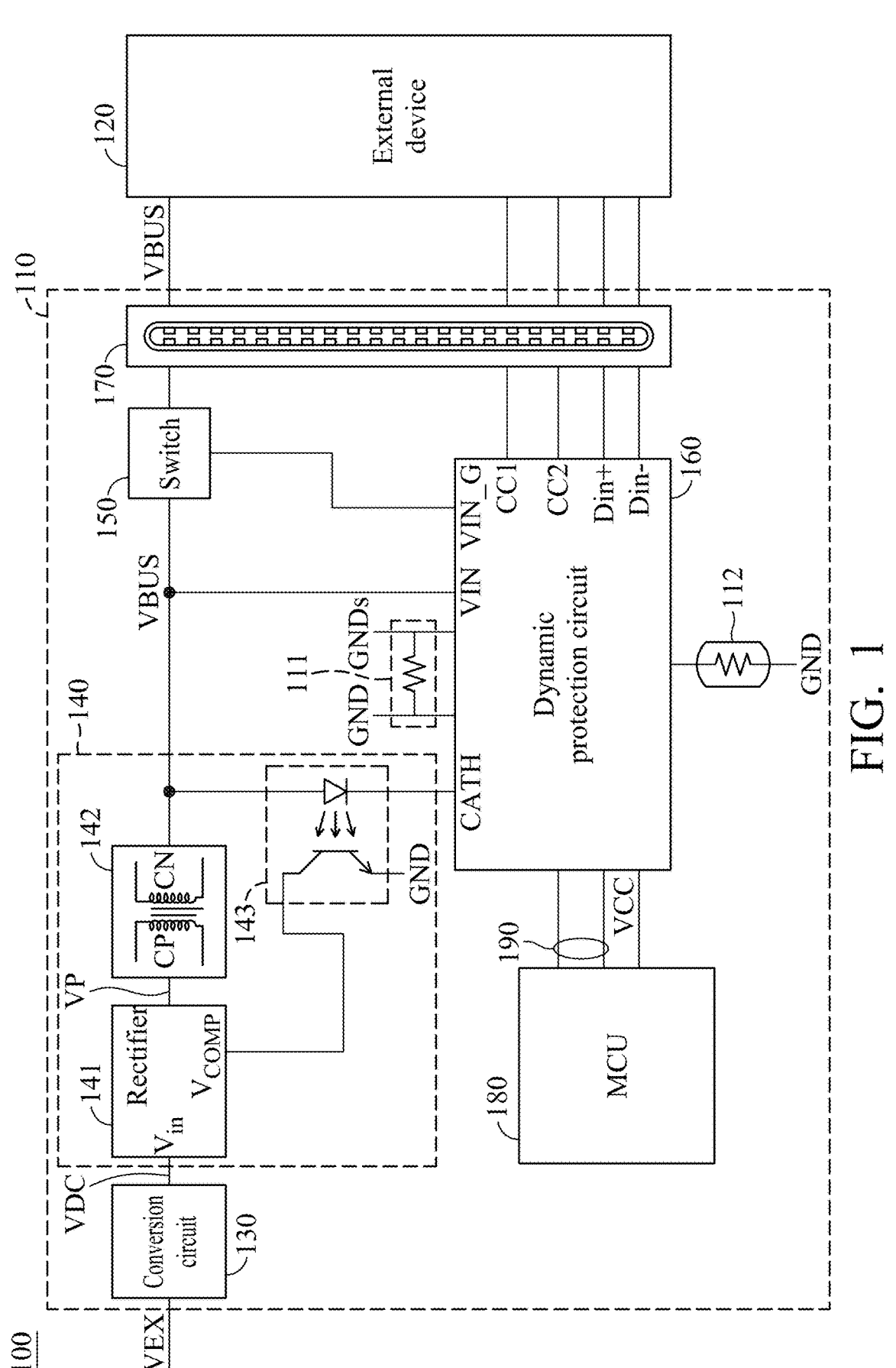
FIG. 1 is a schematic diagram of an exemplary embodiment of an operation system based on various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operation system based on various aspects of the present disclosure. The operation system 100 comprises a power supply circuit 110 and an external device 120. The power supply circuit 110 generates an output voltage VBUS and provides the output voltage VBUS to the external device 120. The external device 120 serves the output voltage VBUS as its own system power. After the external device 120 receives the output voltage VBUS, the external device 120 operates normally. In an embodiment, the power supply circuit 110 may adjust the output voltage VBUS based on the request from another external device (not shown).

In this embodiment, the external device 120 comprises a connection port (not shown). The connection port is configured to receive the output voltage VBUS. In other embodiments, the external device 120 communicates with the power supply circuit 110 via the connection port. In this case, the external device 120 sends a voltage request. The power supply circuit 110 adjusts the level of the output voltage VBUS based on the voltage request from the external device 120.

The power supply circuit 110 comprises a conversion circuit 130, a processing circuit 140, a switch 150, and a dynamic protection circuit 160. The conversion circuit 130 converts an external power VEX into a direct current (DC) power VDC. The type of external power VEX is not limited in the present disclosure. In an embodiment, the external power VEX may be an alternating current (AC) power. In this case, the conversion circuit 130 is an AC-to-DC converter. In another embodiment, the external power VEX is a DC power. In this case, the conversion circuit 130 is a DC-to-DC converter. The conversion circuit 130 converts the voltage level of the external power VEX and provides the converted power as the DC power VDC. The structure of conversion circuit 130 is not limited in the present disclosure. Any circuit can serve as the conversion circuit 130, as long as the circuit is capable of converting power.

The processing circuit 140 processes the DC power VDC to generate the output voltage VBUS. In an embodiment, the processing circuit 140 comprises a rectifier 141, a transformer 142, and a photo coupler 143. The rectifier 141 comprises a pin $V_{in}$ to receive the DC power VDC. The rectifier 141 rectifies the DC power VDC to generate a processed voltage VP. In another embodiment, the rectifier 141 further comprises a pin $V_{COMP}$. The rectifier 141 adjusts the processed voltage VP based on the voltage level of the pin $V_{COMP}$. In this case, when the voltage level of the pin $V_{COMP}$ increases, the rectifier 141 increases the processed voltage VP. When the voltage level of the pin $V_{COMP}$ reduces, the rectifier 141 reduces the processed voltage VP. The structure of rectifier 141 is not limited in the present disclosure. Any circuit can serve as the rectifier 141, as long as the circuit has a rectification function.

The transformer 142 generates the output voltage VBUS based on the processed voltage VP. In this embodiment, the transformer 142 comprises a primary winding CP and a secondary winding CN. When the primary winding CP receives the processed voltage VP, the secondary winding CN generates an induced voltage. In this case, the induced serves as the output voltage VBUS. With increase of the processed voltage VP, the output voltage VBUS is increased. With reduce of the processed voltage VP, the output voltage VBUS is reduced. In an embodiment, the transformer 142 further comprises at least one capacitor (not shown) to store the induced voltage. In this case, the voltage of the capacitor serves as the output voltage VBUS.

The photo coupler 143 is configured to adjust the processed voltage VP. In an embodiment, when the photo coupler 143 is enabled, the photo coupler 143 adjusts the processed voltage VP, such as to increase the processed voltage VP. When the photo coupler 143 is disabled, the photo coupler 143 stops adjusting the processed voltage VP. In an embodiment, the photo coupler 143 controls the voltage level of the pin $V_{COMP}$ of the rectifier 141. In this embodiment, the rectifier 141 adjusts the processed voltage VP based on the voltage level of the pin $V_{COMP}$.

The switch 150 is configured to transmit the output voltage VBUS. In this embodiment, when the switch 150 is turned on, the switch 150 transmits the output voltage VBUS to the connection port 170. When the switch 150 is turned off, the switch 150 stops transmit the output voltage VBUS to the connection port 170. The kind of switch 150 is not limited in the present disclosure. In an embodiment, the switch 150 is a N-type transistor. In other embodiments, the connection port 170 is a universal serial bus (USB) type-C connection port.

The dynamic protection circuit 160 controls the processing circuit 140 and the switch 150 to generate an appropriate output voltage VBUS. In an embodiment, the dynamic protection circuit 160 detects the output voltage VBUS. When the output voltage VBUS does not reach a target voltage, the dynamic protection circuit 160 enables the photo coupler 143 to increase the output voltage VBUS. When the output voltage VBUS reaches the target voltage, the dynamic protection circuit 160 stops enabling the photo coupler 143. In an embodiment, when the output voltage VBUS reaches the target voltage, the dynamic protection circuit 160 turns on the switch 150.

In this embodiment, the dynamic protection circuit 160 has an overvoltage protection function and an undervoltage protection function. For example, when the output voltage VBUS is higher than an upper-limit value, this indicates that an overvoltage event occurs. Therefore, the dynamic protection circuit 160 does not turn on the switch 150 to prevent the output voltage VBUS from damaging the external device 120. When the output voltage VBUS is lower than a lower-limit value, this indicates that an undervoltage event occurs. Therefore, the dynamic protection circuit 160 does not turn on the switch 150 to prevent malfunction of the external device 120. When the output voltage VBUS is not higher than the upper-limit value and is not lower than the lower-limit value, this indicates that the output voltage VBUS is normal. Therefore, the dynamic protection circuit 160 turns on the switch 150. The switch 150 provides the output voltage VBUS to the external device 120. In this embodiment, the dynamic protection circuit 160 is coupled to the switch 150 via the pin VIN_G.

In other embodiments, the power supply circuit 110 further comprises a micro-controller (MCU) 180. The MCU 180 communicates with the dynamic protection circuit 160 via an inter-integrated circuit (I2C) bus 190. The MCU 180 may direct the dynamic protection circuit 160 to adjust the output voltage VBUS. Additionally, the dynamic protection circuit 160 may provide the voltage VCC to the MCU 180. The MCU 180 serves the voltage VCC as its own system voltage.

In an embodiment, the dynamic protection circuit 160 receives a request signal (not shown) from the external device 120 via the connection port 170. For example, the dynamic protection circuit 160 at least comprises pins CC1, CC2, Din+, and Din-. The dynamic protection circuit 160 receives a request signal from the external device 120 via at least one of the pins CC1, CC2, Din+, and Din–. At this case, the dynamic protection circuit 160 decodes the request signal and outputs a decoded result to the MCU 180. The MCU 180 generates a response signal (not shown) based on the request signal from the external device 120. The dynamic protection circuit 160 encodes the response signal and outputs the encoded result to the external device 120 via at least one of the pins CC1, CC2, Din+, and Din–. In an embodiment, the dynamic protection circuit 160 dynamically adjusts the output voltage VBUS based on the response signal generated by the MCU 180.

In other embodiments, the power supply circuit 110 further comprises a current detection device 111. The current detection device 111 determines whether there is an over-current event occurs. When an over-current event occurs, the dynamic protection circuit 160 suspends operation, such as cutting off power to the external device 120 and the MCU 180. In another embodiment, the power supply circuit 110 further comprises a temperature detection device 112. The dynamic protection circuit 160 determines whether the internal temperature of the power supply circuit 110 is greater than a predetermined value based on the detection result generated by the temperature detection device 112. When the internal temperature of the power supply circuit 110 is greater than a predetermined value, the dynamic protection circuit 160 suspends operation.

Figure 2:
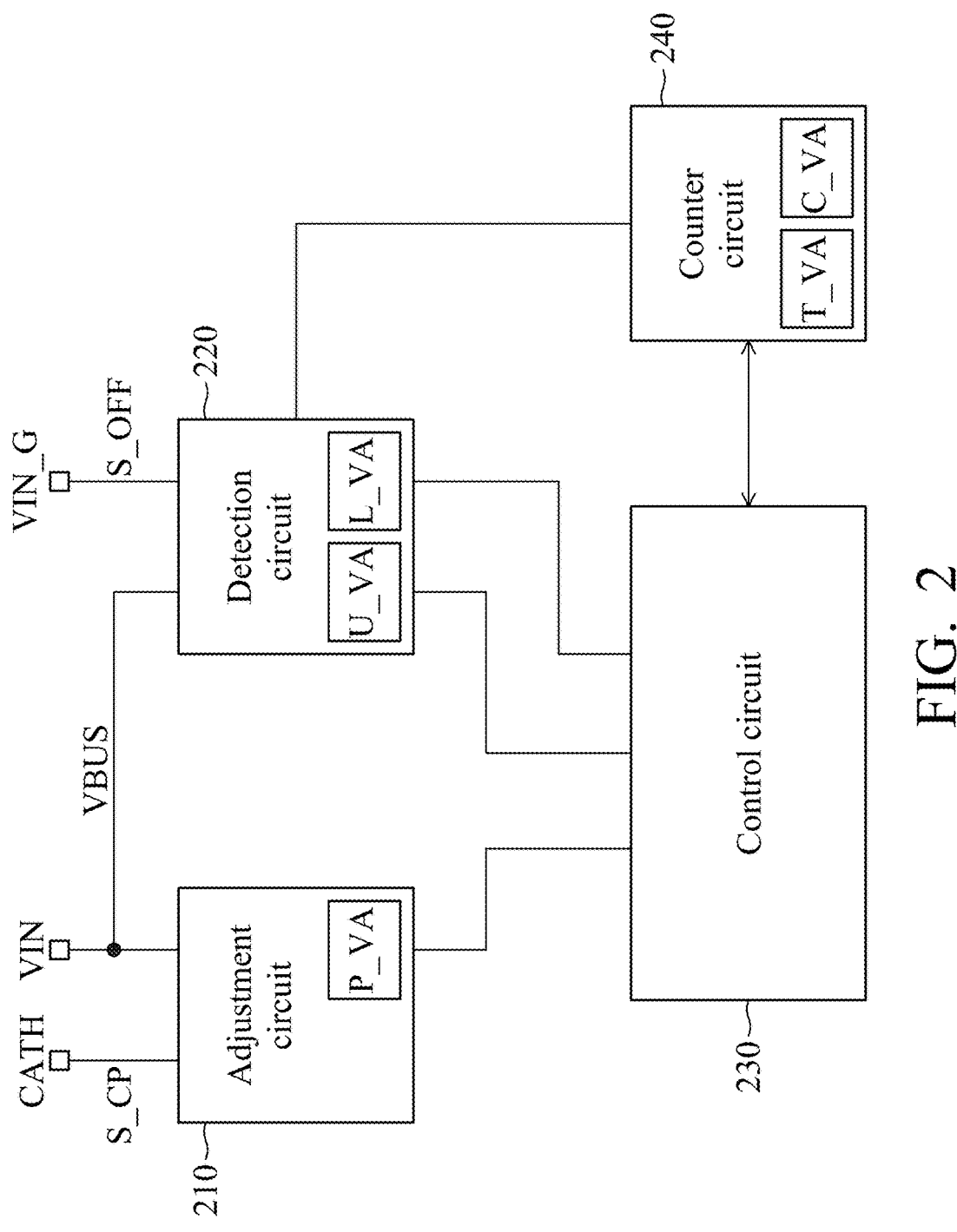
FIG. 2 is a schematic diagram of an exemplary embodiment of a dynamic protection circuit based on various aspects of the present disclosure.

FIG. 2 is a schematic diagram of an exemplary embodiment of the dynamic protection circuit 160 based on various aspects of the present disclosure. The dynamic protection circuit 160 comprises an adjustment circuit 210, a detection circuit 220, a control circuit 230, and a counter circuit 240. The adjustment circuit 210 adjusts the output voltage VBUS based on a predetermined value P_VA. The different predetermined values P_VA correspond to different target voltages. In an embodiment, the predetermined value P_VA is stored in the adjustment circuit 210 in advance and adjusted by an external circuit which is independent of the adjustment circuit 210. In an embodiment, the predetermined value P_VA can be provided by an MCU which is outside of the dynamic protection circuit 160. The MCU may write the predetermined value P_VA to a digital-to-analog converter (not shown) of the adjustment circuit 210 via an I2C bus. In an embodiment, the adjustment circuit 210 comprises a register (not shown) to store the predetermined value P_VA.

The adjustment circuit 210 receives the output voltage VBUS via the pin VIN and sets a compensation signal S_CP based on the output voltage VBUS. For example, when the output voltage VBUS does not arrive to a target voltage, the adjustment circuit 210 enables the compensation signal S_CP and outputs the compensation signal S_CP via the pin CATH. In an embodiment, the photo coupler 143 of FIG. 1 is coupled to the pin CATH to receive the compensation signal S_CP. In this case, the photo coupler 143 controls the voltage level of the pin $V_{COMP}$ of the rectifier 141 based on the enabled compensation signal S_CP. The rectifier 141 increases the processed voltage VP based on the voltage level of the pin $V_{COMP}$. The transformer 142 increases the output voltage VBUS based on the increased processed voltage VP. When the output voltage VBUS arrives to the target voltage, the adjustment circuit 210 stops enabling the compensation signal S_CP. The photo coupler 143 stops adjusting the voltage level of the pin $V_{COMP}$. At this time, the output voltage VBUS is equal to the target voltage. The structure of adjustment circuit 210 is not limited in the present disclosure. Any circuit can serve as the adjustment circuit 210, as long as the circuit is capable of adjusting the output voltage VBUS.

The detection circuit 220 detects whether the output voltage VBUS is higher than an upper-limit value U_VA or lower than a lower-limit value L_VA. In an embodiment, the upper-limit value U_VA and the lower-limit value L_VA are stored in the detection circuit 220 in advance and are adjusted by an external circuit which is independent of the detection circuit 220. In an embodiment, the detection circuit 220 comprises two registers (not shown) to store the upper-limit value U_VA and the lower-limit value L_VA respectively. In other embodiments, the upper-limit value U_VA and the lower-limit value L_VA are provided by an MCU which is disposed outside of the dynamic protection circuit 160 or provided by the control circuit 230.

In an embodiment, when the output voltage VBUS is higher than the upper-limit value U_VA or lower than the lower-limit value L_VA, this indicates that the output voltage VBUS is abnormal. Therefore, the detection circuit 220 enables a turn-off signal S_OFF. When the output voltage VBUS is not higher than the upper-limit value U_VA and not lower than the lower-limit value L_VA, this indicates that the output voltage VBUS is normal. Therefore, the detection circuit 220 does not enable the turn-off signal S_OFF. In an embodiment, the detection circuit 220 outputs the turn-off signal S_OFF to control an external switch via the pin VIN_G.

Taking FIG. 1 as an example, the switch 150 is coupled to the pin VIN_G. When the turn-off signal S_OFF is enabled, the switch 150 is turned off to stop transmitting the output voltage VBUS to the connection port 170. When the turn-off signal S_OFF is not enabled, the switch 150 is turned on to transmit the output voltage VBUS to the connection port 170.

The control circuit 230 is coupled to the adjustment circuit 210 and the detection circuit 220. In an embodiment, the control circuit 230 writes the predetermined value P_VA to the adjustment circuit 210 and writes the upper-limit value U_VA and the lower-limit value L_VA to the detection circuit 220. In this embodiment, the control circuit 230 changes the predetermined value P_VA, and simultaneously, the control circuit 230 disables the detection circuit 220. During the period of disabling the detection circuit 220, the control circuit 230 proportionally adjusts the upper-limit value U_VA and the lower-limit value L_VA.

In an embodiment, the control circuit 230 appropriately adjusts the upper-limit value U_VA and the lower-limit value L_VA based on the output voltage VBUS. For example, when the output voltage VBUS increases, the control circuit 230 increases the upper-limit value U_VA and the lower-limit value L_VA. In an embodiment, the upper-limit value U_VA and the lower-limit value L_VA are increased by the same amount as the output voltage VBUS is increased. Similarly, when the output voltage VBUS reduces, the control circuit 230 reduces the upper-limit value U_VA and the lower-limit value L_VA. In an embodiment, the upper-limit value U_VA and the lower-limit value L_VA are reduced by the same amount as the output voltage VBUS is reduced. In an embodiment, after the output voltage VBUS is steady (that is, the output voltage VBUS arrives to a target voltage), the control circuit 230 then adjusts the upper-limit value U_VA and the lower-limit value L_VA based on the amplitude of the change in the output voltage VBUS.

In other embodiment, during the period of disabling the detection circuit 220, the control circuit 230 adjusts the upper-limit value U_VA and the lower-limit value L_VA based on the predetermined value P_VA. For example, when a new predetermined value P_VA is greater than the original predetermined value P_VA, the control circuit 230 increases the upper-limit value U_VA and the lower-limit value L_VA. When the new predetermined value P_VA is lower than the original predetermined value P_VA, the control circuit 230 reduces the upper-limit value U_VA and the lower-limit value L_VA.

The present disclosure does not limit how the control circuit 230 adjusts the upper-limit value U_VA and the lower-limit value L_VA based on the predetermined value P_VA. In an embodiment, the control circuit 230 uses a predetermine formula to calculate the predetermined value P_VA to generate an overvoltage protection value and an undervoltage protection value. In this case, the detection circuit 220 serves the overvoltage protection value as the upper-limit value U_VA and serves the undervoltage protection value as the lower-limit value L_VA. In another embodiment, the control circuit 230 uses a look-up table to obtain an overvoltage protection value and an undervoltage protection value which correspond to the predetermined value P_VA. The different predetermined values P_VA correspond to different overvoltage protection values and different undervoltage protection values. In this case, the control circuit 230 serves the overvoltage protection value as the upper-limit value U_VA and serves the undervoltage protection value as the lower-limit value L_VA.

In an embodiment, the control circuit 230 changes the predetermined value P_VA based on a control command (not shown). Taking FIG. 1 as an example, the MCU 180 generates a control command and provides the control command to the control circuit 230 via the I2C bus 190. In this case, the control circuit 230 changes the predetermined value P_VA based on the control command. In other embodiments, the control circuit 230 adjusts the upper-limit value U_VA and the lower-limit value L_VA based on the control command.

When the detection circuit 220 is disabled, the counter circuit 240 starts to adjust the count value C_VA. In an embodiment, when the control circuit 230 disables the detection circuit 220, the control circuit 230 enables the counter circuit 240 so that the counter circuit 240 starts to adjust the count value C_VA. In an embodiment, before enabling the counter circuit 240, the control circuit 230 resets the counter circuit 240 to set the count value C_VA to an initial value. Then, the counter circuit 240 starts to adjust the count value C_VA.

When the counter circuit 240 adjusts the count value C_VA, the control circuit 230 proportionally adjusts the upper-limit value U_VA and the lower-limit value L_VA. When the count value C_VA is equal to a target value T_VA, the counter circuit 240 enables the detection circuit 220. In another embodiment, the count value C_VA is equal to the target value T_VA, the control circuit 230 enables the detection circuit 220. Then, the detection circuit 220 determines whether the output voltage VBUS is within the upper-limit value U_VA and the lower-limit value L_VA. When the output voltage VBUS is higher than the upper-limit value U_VA or lower than the lower-limit value L_VA, the detection circuit 220 enables the turn-off signal S_OFF.

In an embodiment, the target value T_VA is provided by the control circuit 230. In this case, when the control circuit 230 adjusts the predetermined value P_VA, the control circuit 230 also adjusts the target value T_VA. Different predetermined values P_VA correspond to different target values T_VA. After setting the target value T_VA, the control circuit 230 re-triggers the counter circuit 240. When the count value C_VA is equal to the target value T_VA, the counter circuit 240 stops adjusting the count value C_VA and the control circuit 230 stops adjusting the upper-limit value U_VA and the lower-limit value L_VA. The detection circuit 220 determines whether the output voltage VBUS is higher than the adjusted upper-limit value U_VA or lower than the adjusted lower-limit value L_VA.

Figure 3:
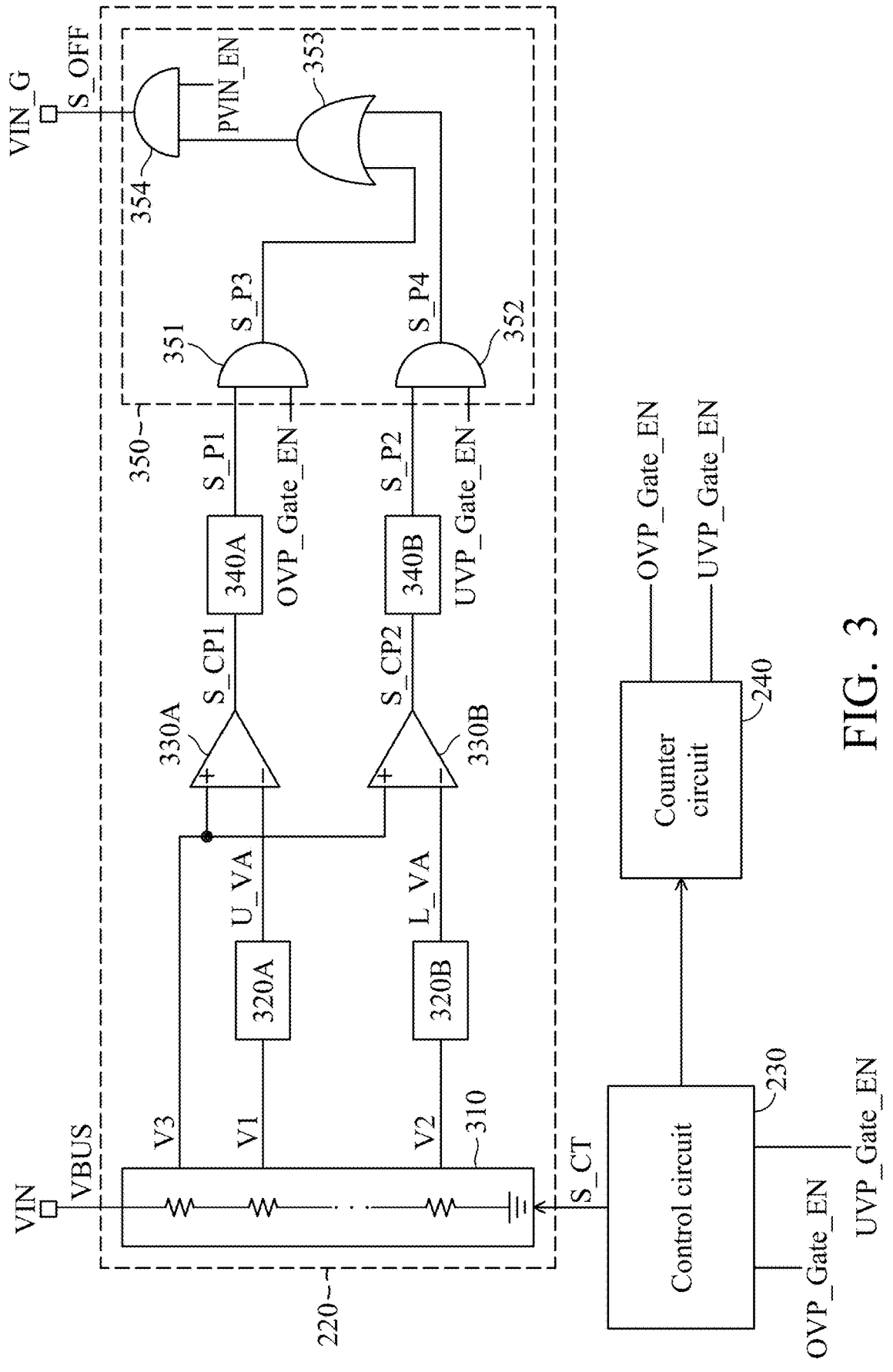
FIG. 3 is a schematic diagram of an exemplary embodiment of a detection circuit based on various aspects of the present disclosure.

FIG. 3 is a schematic diagram of an exemplary embodiment of a detection circuit based on various aspects of the present disclosure. The detection circuit 220 comprises a voltage-divider circuit 310, processing circuits 320A and 320B, comparators 330A and 330B, digital debounce circuits 340A and 340B, and a logic circuit 350. The voltage-divider circuit 310 divides the output voltage VBUS to generate the voltages V1 and V2. In an embodiment, the voltage-divider circuit 310 comprises a plurality of resistor strings to generate a plurality of divided voltages. In this case, the voltage-divider circuit 310 provides one of the divided voltages as the voltage V1 and provides another of the divided voltages as the voltage V2 based on a control signal S_CT. In an embodiment, the control signal S_CT is provided by the control circuit 230.

The processing circuit 320A generates the upper-limit value U_VA based on the voltage V1. The processing circuit 320B generates the lower-limit value L_VA based on the voltage V2. The structures of processing circuits 320A and 320B are not limited in the present disclosure. In an embodiment, the processing circuits 320A and 320B are storage circuits. The processing circuit 320A stores the voltage V1 and serves the voltage V1 as the upper-limit value U_VA. The processing circuit 320B stores the voltage V2 and serves the voltage V2 as the lower-limit value L_VA. In another embodiments, the processing circuits 320A and 320B are digital-to-analog converters (DACs). In this case, the processing circuit 320A converts the voltage V1 and serves the converted result as the upper-limit value U_VA, and the processing circuit 320B converts the voltage V2 and serves the converted result as the lower-limit value L_VA.

The comparator 330A generates a comparison signal S_CP1 based on the output voltage VBUS and the upper-limit value U_VA. The comparator 330B generates a comparison signal S_CP2 based on the output voltage VBUS and the lower-limit value L_VA. In an embodiment, the comparators 330A and 330B are coupled to the pin VIN to receive the output voltage VBUS. In another embodiment, the voltage-divider circuit 310 divides the output voltage VBUS to generate a voltage V3. In this case, the comparator 330A compares the voltage V3 and the upper-limit value U_VA to generate the comparison signal S_CP1. Additionally, the comparator 330B compares the voltage V3 and the lower-limit value L_VA to generate the comparison signal S_CP2. In an embodiment, even if the output voltage VBUS is high, since the voltage-divider circuit 310 reduces the output voltage VBUS and serves the reduced voltage as the voltage V3, the comparators 330A and 330B do not need to withstand high voltages.

The digital debounce circuit 340A processes the comparison signal S_CP1 to generate a processed signal S_P1. The digital debounce circuit 340B processes the comparison signal S_CP2 to generate a processed signal S_P2. In an embodiment, the digital debounce circuits 340A and 340B can be omitted. In this case, the logic circuit 350 directly receives the comparison signals S_CP1 and S_CP2.

The logic circuit 350 sets the turn-off signal S_OFF based on the processed signals S_P1 and S_P2. In this case, the logic circuit 350 further receives an overvoltage function signal OVP_Gate_EN and an undervoltage function signal UVP_Gate_EN. The overvoltage function signal OVP_Gate_EN and the undervoltage function signal UVP_Gate_EN are controlled by an external circuit which is independent of the detection circuit 220. In an embodiment, the control circuit 230 provides the overvoltage function signal OVP_Gate_EN and the undervoltage function signal UVP_Gate_EN.

Taking the overvoltage function signal OVP_Gate_EN as an example, the control circuit 230 may sets the overvoltage function signal OVP_Gate_EN to a specific level, such as a low level. The case in which the overvoltage function signal OVP_Gate_EN is at the specific level indicates that the overvoltage function signal OVP_Gate_EN is disabled. Therefore, the logic circuit 350 pauses an overvoltage detection operation. However, when the overvoltage function signal OVP_Gate_EN is not at the specific level, this indicates that the overvoltage function signal OVP_Gate_EN is enabled. Therefore, the logic circuit 350 performs the overvoltage detection operation. At this time, when the voltage V3 is greater than the upper-limit value U_VA, this indicates that an overvoltage event occurs. Therefore, the logic circuit 350 enables the turn-off signal S_OFF. However, when the voltage V3 is not greater than the upper-limit value U_VA, this indicates that no overvoltage event occurs. Therefore, the logic circuit 350 does not enable the turn-off signal S_OFF.

In another embodiment, when the undervoltage function signal UVP_Gate_EN is enabled, the logic circuit 350 performs an undervoltage detection operation. When the voltage V3 is smaller than the lower-limit value L_VA, this indicates that an undervoltage event occurs. Therefore, the logic circuit 350 enables the turn-off signal S_OFF. However, when the voltage V3 is not smaller than the lower-limit value L_VA, this indicates that no undervoltage event occurs. Therefore, the logic circuit 350 does not enable the turn-off signal S_OFF. In an embodiment, when the undervoltage function signal UVP_Gate_EN is not enabled, the logic circuit 350 pauses the undervoltage detection operation.

In other embodiments, when the overvoltage function signal OVP_Gate_EN and the undervoltage function signal UVP_Gate_EN are enabled, the logic circuit 350 performs an overvoltage detection operation and an undervoltage detection operation. When an overvoltage event or an undervoltage event occurs, the logic circuit 350 enables the turn-off signal S_OFF. When an overvoltage event and an undervoltage event do not occur, the logic circuit 350 does not enable the turn-off signal S_OFF.

In an embodiment, when the control circuit 230 changes the predetermined value P_VA, the control circuit 230 does not enable the overvoltage function signal OVP_Gate_EN and the undervoltage function signal UVP_Gate_EN. Therefore, the logic circuit 350 pauses the overvoltage detection operation and the undervoltage detection operation. In this case, the control circuit 230 uses the control signal S_CT to adjust the upper-limit value U_VA and the lower-limit value L_VA and triggers the counter circuit 240. When the counter circuit 240 finishes a timing operation (e.g., the count value of the counter circuit 240 reaches a target value T_VA), the counter circuit 240 enables the overvoltage function signal OVP_Gate_EN and the undervoltage function signal UVP_Gate_EN. In another embodiment, when the counter circuit 240 finishes a timing operation, the counter circuit 240 notifies the control circuit 230 so that the control circuit 230 enables the overvoltage function signal OVP_Gate_EN and the undervoltage function signal UVP_Gate_EN.

In this embodiment, the logic circuit 350 comprises logic gates 351~354. The logic gate 351 generates a processed signal S_P3 based on the processed signal S_P1 and the overvoltage function signal OVP_Gate_EN. In other embodiments, when the digital debounce circuit 340A is omitted, the logic gate 351 generates the processed signal S_P3 based on the comparison signal S_CP1 and the overvoltage function signal OVP_Gate_EN. In this embodiment, the logic gate 351 is an AND gate. In an embodiment, the comparator 330A and the logic gate 351 constitute an overvoltage protection circuit.

The logic gate 352 generates a processed signal S_P4 based on the processed signal S_P2 and the undervoltage function signal UVP_Gate_EN. In other embodiment, when the digital debounce circuit 340B is omitted, the logic gate 352 generates the processed signal S_P4 based on the comparison signal S_CP2 and the undervoltage function signal UVP_Gate_EN. In this embodiment, the logic gate 352 is an AND gate. In an embodiment, the comparator 330B and the logic gate 352 constitute an undervoltage protection circuit.

The logic gate 353 receives the processed signals S_P3 and S_P4. The logic gate 354 controls the turn-off signal S_OFF based on the output of the logic gate 353. In an embodiment, the logic gate 354 further receives a set signal PVIN_EN. When the set signal PVIN_EN is not enabled, the logic gate 354 does not enable the turn-off signal S_OFF. In this embodiment, the logic gate 353 is a OR gate and the logic gate 354 is an AND gate.

Figure 4:
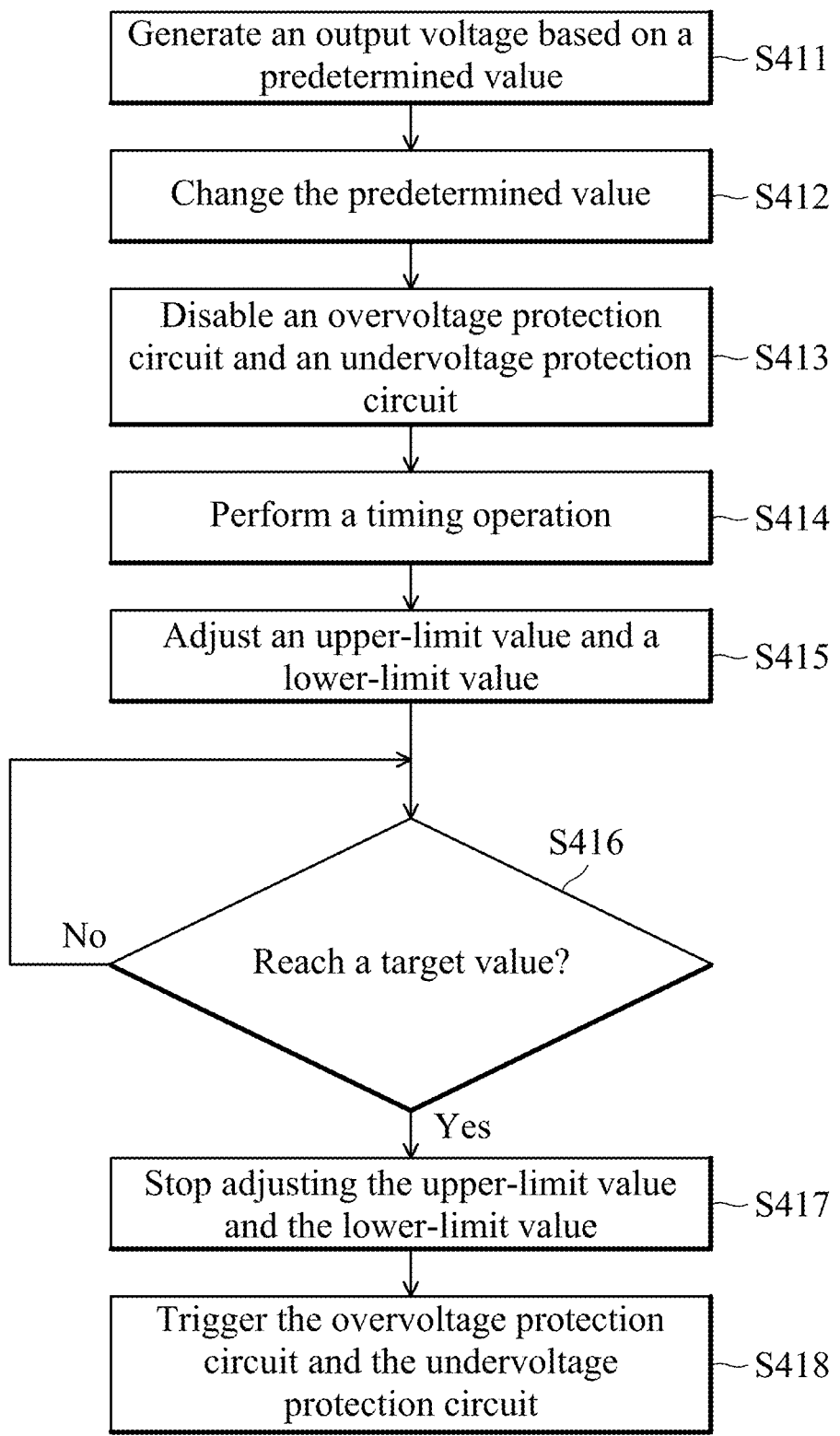
FIG. 4 is a flowchart of an exemplary embodiment of a control method in accordance with an embodiment of the present disclosure.

FIG. 4 is a flowchart of an exemplary embodiment of a control method in accordance with an embodiment of the present disclosure. The control method may take the form of a program code. When the program code is loaded into and executed by a machine, the machine thereby becomes a power supply circuit for practicing the control method. First, an output voltage is generated based on a predetermined value (step S411). Different predetermined values correspond to different output voltages. In an embodiment, the power supply circuit provides the output voltage to an external device. In this case, the external device is a powered device.

Then, the predetermined value is changed (step S412), and an overvoltage protection circuit and an undervoltage protection circuit are disabled (step S413). The present disclosure does not limit the order in which steps S412 and S413 are performed. In an embodiment, steps S412 and S413 may be performed simultaneously. In another embodiment, step S412 is performed earlier than or later than step S413.

In an embodiment, an external device sends a voltage request to request that the power supply circuit changes the output voltage, such as to increase the output voltage. In this case, the power supply circuit decodes the voltage request and adjusts the predetermined value based on the decoded result. Since the output voltage is associated with the predetermined value, when the predetermined value is adjusted, the output voltage is changed.

In another embodiment, the overvoltage protection circuit operates based on an overvoltage function signal, and the undervoltage protection circuit operates based on an undervoltage function signal. In this case, when the overvoltage function signal is enabled, the overvoltage protection circuit starts to determine whether an output voltage is higher than an upper-limit value. When the overvoltage function signal is not enabled, the overvoltage protection circuit stops determining whether the output voltage is higher than the upper-limit value. Similarly, when the undervoltage function signal is enabled, the undervoltage protection circuit starts to determine whether the output voltage is lower than the lower-limit value. When the undervoltage function signal is not enabled, the undervoltage protection circuit stops determining whether the output voltage is lower than the lower-limit value.

Then, a timing operation is performed (step S414). In an embodiment, step S414 is performed to enable a counter circuit. When the counter circuit is enabled, the counter circuit performs a timing operation. For example, the counter circuit may adjust a count value based on the number of pulses of a clock signal. When the count value of the counter circuit reaches a target value, the counter circuit stops operating. In an embodiment, the step S412 is performed to provide a target value to the counter circuit. In this case, different predetermined values may correspond to different target values.

An upper-limit value and a lower-limit value are adjusted (step S415). In an embodiment, the step S415 is performed to proportionally adjust the upper-limit value and the lower-limit value based on a changed predetermined value. In this case, whenever the predetermined value is changed, the upper-limit value of the overvoltage protection circuit and the lower-limit value of the undervoltage protection circuit are adjusted proportionally. The step S415 is performed to substitute the changed predetermined value into a specific formula to calculate a corresponding overvoltage protection value and a corresponding undervoltage protection value. In this case, the step S415 is performed to write the overvoltage protection value to the overvoltage protection circuit and write the undervoltage protection value to the overvoltage protection circuit. In another embodiment, the step S415 is performed to utilize a look-up table to obtain a corresponding overvoltage protection value and a corresponding undervoltage protection value. In this case, the look-up table records a plurality of predetermined values. Each predetermined value corresponds an overvoltage protection value and an undervoltage protection value.

Next, a determination is made as to whether the duration of the timing operation has reached a target value (step S416). In an embodiment, the step S416 is performed to determine whether the count value of a counter has reached a target value. When the duration of the timing operation reaches a target value, the steps S417 and S418 are performed. The step S417 is performed to stop adjusting the upper-limit value and the lower-limit value. The step S418 is performed to trigger the overvoltage protection circuit and the undervoltage protection circuit. In an embodiment, the step S418 is performed to enable the overvoltage function signal and the undervoltage function signal. Therefore, the overvoltage protection circuit operates based on the adjusted upper-limit value, and the undervoltage protection circuit operates based on the adjusted lower-limit value.

Since the upper-limit value and the lower-limit value of the power supply circuit are changed based on the predetermined value, when the power supply circuit adjusts the output voltage based on a request signal, the power supply circuit first turns off the overvoltage protection function and the undervoltage protection function. After adjusting the upper-limit value of the overvoltage protection circuit and the lower-limit value of the undervoltage protection circuit, the power supply circuit turns on the overvoltage protection function and the undervoltage protection function. Since the time point when the power supply circuit adjusts the upper-limit value and the lower-limit value is similar to the time point when the power supply circuit adjusts the output voltage, the power supply circuit provides the overvoltage protection function and the undervoltage protection function at an appropriate time point.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes a power supply circuit for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a power supply circuit for practicing the disclosed methods. When implemented on a general-purpose processor, the program code combines with the processor to provide a unique apparatus that operates analogously to application-specific logic circuits. Additionally, "enable" shall mean changing the state of a Boolean signal. Boolean signals may be enabled high or with a higher voltage, and Boolean signals may be enabled low or with a lower voltage, at the discretion of the circuit designer. Similarly, "disable" shall mean changing the state of the Boolean signal to a voltage level opposite the enabled state.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dynamic protection circuit comprising:

an adjustment circuit configured to adjust an output voltage based on a predetermined value;

a detection circuit configured to detect whether the output voltage is higher than an upper-limit value or lower than a lower-limit value;

a control circuit configured to change the predetermined value and disable the detection circuit while the predetermined value is being changed; and a counter circuit configured to start to adjust a count value in response to the detection circuit being disabled, wherein:

in response to the counter circuit adjusting the count value, the control circuit adjusts the upper-limit value and the lower-limit value to be proportional to the output voltage, and in response to the count value being equal to a target value, the counter circuit enables the detection circuit.

2. The dynamic protection circuit as claimed in claim 1, wherein the detection circuit comprises:

a voltage-divider circuit configured to divide the output voltage to generate a first voltage and a second voltage;

a first digital-to-analog converter configured to generate the upper-limit value based on the first voltage; and a second digital-to-analog converter configured to generate the lower-limit value based on the second voltage.

3. The dynamic protection circuit as claimed in claim 2, wherein the detection circuit further comprises:

a first comparator configured to generate a first comparison signal based on the output voltage and the upper-limit value;

a second comparator configured to generate a second comparison signal based on the output voltage and the lower-limit value; and a logic circuit configured to enable a turn-off signal based on the first comparison signal and the second comparison signal.

4. The dynamic protection circuit as claimed in claim 3, wherein the voltage-divider circuit divides the output voltage to generate a third voltage, the first comparator compares the third voltage and the upper-limit value to generate the first comparison signal, and the second comparator compares the third voltage and the lower-limit value to generate the second comparison signal.

5. The dynamic protection circuit as claimed in claim 3, wherein the detection circuit further comprises:

a first digital debounce circuit configured to process the first comparison signal to generate a first processed signal; and a second digital debounce circuit configured to process the second comparison signal to generate a second processed signal, wherein the logic circuit enables the turn-off signal based on the first processed signal and the second processed signal.

6. The dynamic protection circuit as claimed in claim 3, wherein the logic circuit comprises:

a first logic gate configured to generate a third processed signal based on the first comparison signal and an overvoltage function signal;

a second logic gate configured to generate a fourth processed signal based on the second comparison signal and an undervoltage function signal; and a third logic gate configured to enable the turn-off signal based on the third processed signal and the fourth processed signal.

7. The dynamic protection circuit as claimed in claim 6, wherein the control circuit sets the overvoltage function signal and the undervoltage function signal to be equal to a specific level to disable the turn-off signal, and in response to the count value not being equal to the target value, the counter circuit sets the overvoltage function signal and the undervoltage function signal to be unequal to the specific level.

8. The dynamic protection circuit as claimed in claim 1, wherein in response to the control circuit setting the predetermined value, the control circuit adjusts the target value.

9. The dynamic protection circuit as claimed in claim 1, wherein in response to the output voltage increasing, the control circuit increases the upper-limit value and the lower-limit value, and in response to the output voltage dropping, the control circuit reduces the upper-limit value and the lower-limit value.

10. The dynamic protection circuit as claimed in claim 1, wherein in response to the count value being equal to the target value, the counter circuit stops adjusting the count value and the control circuit stops adjusting the upper-limit value and the lower-limit value.

11. A power supply circuit comprising:

a conversion circuit configured to convert an external power into a direct current (DC) power;

a processing circuit configured to process the DC power to generate an output voltage;

a switch configured to transmit the output voltage; and a dynamic protection circuit comprising:

an adjustment circuit configured to adjust the output voltage based on the predetermined value;

a detection circuit configured to detect whether the output voltage is higher than an upper-limit value or lower than a lower-limit value;

a control circuit configured to change the predetermined value and disable the detection circuit while the predetermined value is being changed; and a counter circuit configured to start to adjust a count value in response to the detection circuit being disabled, wherein:

in response to the counter circuit adjusting the count value, the control circuit adjusts the upper-limit value and the lower-limit value to be proportional to the output voltage, and in response to the count value being equal to a target value, the counter circuit enables the detection circuit.

12. The power supply circuit as claimed in claim 11, wherein the processing circuit comprises:

a rectifier configured to rectify the DC power to generate a processed voltage;

a transformer comprising a primary winding and a secondary winding, wherein in response to the primary winding receiving the processed voltage, the secondary winding generates the output voltage; and a photo coupler configured to adjust the processed voltage.

13. The power supply circuit as claimed in claim 12, wherein the adjustment circuit controls the photo coupler based on the output voltage.

14. The power supply circuit as claimed in claim 13, wherein in response to the output voltage not reaching a target value, the adjustment circuit enables the photo coupler to adjust the processed voltage, and in response to the output voltage reaching the target value, the adjustment circuit stops enabling the photo coupler to stop adjusting the processed voltage.

15. The power supply circuit as claimed in claim 11, wherein in response to the output voltage being higher than the upper-limit value or lower than the lower-limit value, the detection circuit turns off the switch so that the switch stops transmitting the output voltage, and in response to the output voltage not being higher than the upper-limit value and not being lower than the lower-limit value, the detection circuit turns on the switch so that the switch transmits the output voltage.

16. The power supply circuit as claimed in claim 11, further comprising:

a micro-controller configured to generate a control command to direct the control circuit to change the predetermined value.

17. The power supply circuit as claimed in claim 16, wherein the micro-controller uses an inter-integrated circuit (I2C) bus to provide the control command to the control circuit.

18. The power supply circuit as claimed in claim 17, further comprising:

a connection port configured to be coupled to the switch to transmit the output voltage to an external device, wherein the external device is independent of the power supply circuit.

19. The power supply circuit as claimed in claim 11, wherein the control circuit obtains an overvoltage protection value and an undervoltage protection value based on a look-up table, provides the overvoltage protection value as the upper-limit value, and provides the undervoltage protection value as the lower-limit value.

20. A control method comprising:

generating an output voltage based on a predetermined value;

changing the predetermined value;

disabling an overvoltage protection circuit and an under-voltage protection circuit, wherein the overvoltage protection circuit determines whether the output voltage is higher than an upper-limit value, and the undervoltage protection circuit determines whether the output voltage is lower than a lower-limit value;

performing a timing operation;

adjusting the upper-limit value and the lower-limit value;

in response to the duration of the timing operation reaching a target value:

stopping the adjustment of the upper-limit value and the lower-limit value; and stopping the disabling of the overvoltage protection circuit and the undervoltage protection circuit.

\* \* \* \* \*